(12) United States Patent
Tao

(10) Patent No.: US 11,928,341 B2
(45) Date of Patent: Mar. 12, 2024

(54) SLEEP CONTROL METHOD AND SLEEP CONTROL CIRCUIT

(71) Applicant: CHANGXIN MEMORY TECHNOLOGIES, INC., Hefei (CN)

(72) Inventor: Yufeng Tao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 138 days.

(21) Appl. No.: 17/849,975

(22) Filed: Jun. 27, 2022

(65) Prior Publication Data

US 2023/0266891 A1 Aug. 24, 2023

Related U.S. Application Data

(63) Continuation of application No. PCT/CN2022/080483, filed on Mar. 11, 2022.

(30) Foreign Application Priority Data

Feb. 24, 2022 (CN) .......................... 202210174059.7

(51) Int. Cl.
*G06F 3/06* (2006.01)
*G06F 13/40* (2006.01)

(52) U.S. Cl.
CPC ............ *G06F 3/0625* (2013.01); *G06F 3/061* (2013.01); *G06F 13/40* (2013.01)

(58) Field of Classification Search
CPC ......... G06F 3/061; G06F 3/0625; G06F 13/40
See application file for complete search history.

(56) References Cited

U.S. PATENT DOCUMENTS

| 5,640,349 | A | 6/1997 | Kakinuma |
| 6,522,581 | B2 | 2/2003 | Takata |
| 9,377,838 | B2 * | 6/2016 | Shouno ................. G06F 1/3215 |
| 10,846,171 | B2 | 11/2020 | Cho |
| 2002/0051401 | A1 | 5/2002 | Lee |
| 2006/0112239 | A1 | 5/2006 | Ruckerbauer |
| 2006/0200728 | A1 | 9/2006 | Nagai |

(Continued)

FOREIGN PATENT DOCUMENTS

| CN | 1156280 A | 8/1997 |
| CN | 1804815 A | 7/2006 |

(Continued)

*Primary Examiner* — Zachary K Huson
(74) *Attorney, Agent, or Firm* — Cooper Legal Group, LLC

(57) ABSTRACT

The disclosure relates to a sleep control method and a sleep control circuit, a data transmission circuit includes at least two data transmission structures, each includes a storage transmission end, a bus transmission end, and an interactive transmission end, the storage transmission end is connected to a storage area, the bus transmission end is connected to a data bus, and the interactive transmission end is connected to another data transmission structure; the method includes: in a sleep stage, sleep data is transmitted to the data bus; the bus transmission end and the storage transmission end are turned on, a sending terminal of the interactive transmission end is turned on, and a receiving terminal of the interactive transmission end is turned off, so that data input from the bus transmission end is output through the storage transmission end and the interactive transmission end.

15 Claims, 7 Drawing Sheets

(56) References Cited

U.S. PATENT DOCUMENTS

| | | | |
|---|---|---|---|
| 2008/0307161 | A1 | 12/2008 | Wei |
| 2017/0285989 | A1* | 10/2017 | Lai .................. G06F 3/0688 |
| 2020/0236465 | A1* | 7/2020 | Li .................. H04R 1/1041 |
| 2021/0191809 | A1 | 6/2021 | Song et al. |
| 2021/0407576 | A1 | 12/2021 | Shang et al. |
| 2022/0092007 | A1 | 3/2022 | Ji |

FOREIGN PATENT DOCUMENTS

| | | | |
|---|---|---|---|
| CN | 1832489 | A | 9/2006 |
| CN | 101281481 | A | 10/2008 |
| CN | 101354666 | A | 1/2009 |
| CN | 108447514 | A | 8/2018 |
| CN | 113094203 | A | 7/2021 |
| CN | 113470711 | A | 10/2021 |
| CN | 114255806 | A | 3/2022 |
| EP | 4009326 | A1 | 6/2022 |
| WO | 2022062497 | A1 | 3/2022 |

* cited by examiner

US 11,928,341 B2

SLEEP CONTROL METHOD AND SLEEP CONTROL CIRCUIT

CROSS-REFERENCE TO RELATED APPLICATIONS

The present application is a continuation of International Application No. PCT/CN2022/080483, filed on Mar. 11, 2022, which claims priority to Chinese patent application 202210174059.7, filed on Feb. 24, 2022 and entitled "SLEEP CONTROL METHOD AND SLEEP CONTROL CIRCUIT". The disclosures of International Application No. PCT/CN2022/080483 and Chinese patent application 202210174059.7 are hereby incorporated by reference in their entireties.

BACKGROUND

A Dynamic Random Access Memory (DRAM) has the characteristics of data non-volatility, power saving, small size, and no mechanical structure, and is suitable to serve as a storage device for a mobile device.

With the advancement of technology, consumers have higher requirements for performances of mobile devices, so that a transmission rate of a storage device becomes a key parameter for determining quality of the storage device. How to improve data transmission efficiency of the memory is a problem urgent to be solved by technicians at present.

SUMMARY

The disclosure relates to the field of design of semiconductor circuits, and in particular to a sleep control method and a sleep control circuit.

An embodiment of the disclosure provides a sleep control method applied to a data transmission circuit, the data transmission circuit includes: the data transmission circuit includes at least two data transmission structures; each data transmission structure includes a storage transmission end, a bus transmission end, and an interactive transmission end, the storage transmission end is configured to be connected to a storage area, the bus transmission end is configured to be connected to a data bus, and the interactive transmission end is configured to be connected to another data transmission structure; the sleep control method includes: in a sleep stage, sleep data is transmitted to the data bus; the bus transmission end and the storage transmission end are turned on, a sending terminal of the interactive transmission end is turned on, and a receiving terminal of the interactive transmission end is turned off, so that data input from the bus transmission end is output through the storage transmission end and the interactive transmission end.

Another embodiment of the disclosure provides a sleep control circuit, which is applied to the foregoing sleep control method, and includes: a data providing unit, configured to send sleep data to a data bus in a sleep stage; a first data control unit, configured to, in the sleep stage, turn on the storage transmission end and the bus transmission end, control the data transmission circuit to receive the sleep data transmitted from the data bus, and to send the sleep data to a storage area; and a second data control unit, configured to, in the sleep stage, turn on the interactive transmission end, and control the data transmission structure to send the sleep data to another data transmission structure, and to reject to receive the sleep data sent by the another data transmission structure.

BRIEF DESCRIPTION OF THE DRAWINGS

One or more embodiments are exemplarily illustrated by pictures in the corresponding drawings, and these exemplary descriptions do not constitute a limitation on the embodiments, and unless otherwise stated, the pictures in the drawings do not constitute a scale limitation. In order to describe the technical solutions in the embodiments of this disclosure or a conventional art more clearly, the drawings required to be used in descriptions about the embodiments will be simply introduced below. It is apparent that the drawings described below are only some embodiments of this disclosure, and other drawings may further be obtained by those of ordinary skilled in the art according to these drawings without creative work.

DETAILED DESCRIPTION

With the advancement of technology, consumers have higher requirements for performances of mobile devices, so that a transmission rate of a storage device becomes a key parameter for determining quality of the storage device. How to improve data transmission efficiency of a memory is a problem urgent to be solved by technicians at present.

Based on the above problems, the disclosure provides a data transmission circuit. Furthermore, an embodiment of the disclosure provides a sleep control method, in particular, provides a sleep control method for a data transmission circuit aiming at improving read/write data transmission efficiency of a memory.

It can be understood by those skilled in the art that, in various embodiments of the disclosure, many technical details are provided for readers to better understand the disclosure. However, even without these technical details and various changes and modifications based on the following various embodiments, the technical solutions claimed in the disclosure may be implemented. The following divisions of the various embodiments are for the convenience of description, and should not constitute any limitation on specific implementation modes of the disclosure. The various embodiments may be combined with each other and referred to each other under the premise of no contradiction.

Figure 1:
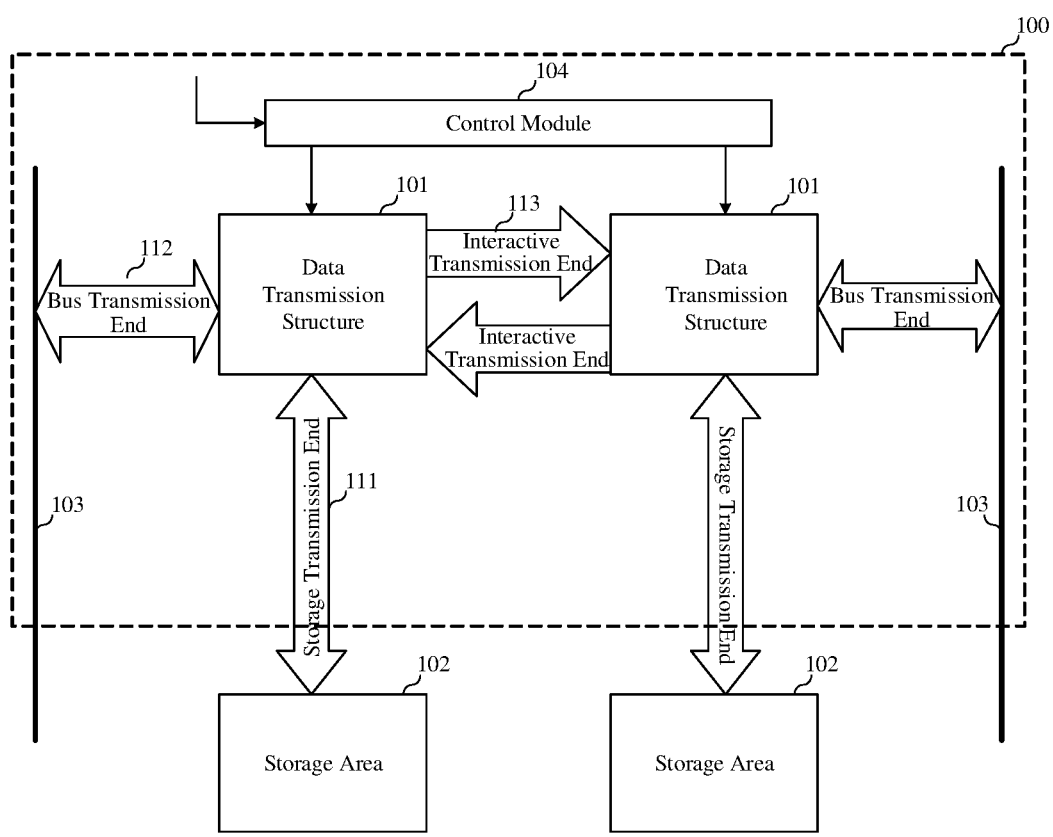
FIG. 1 is a schematic structural diagram of a data transmission circuit according to an embodiment of the disclosure.
Figure 2:
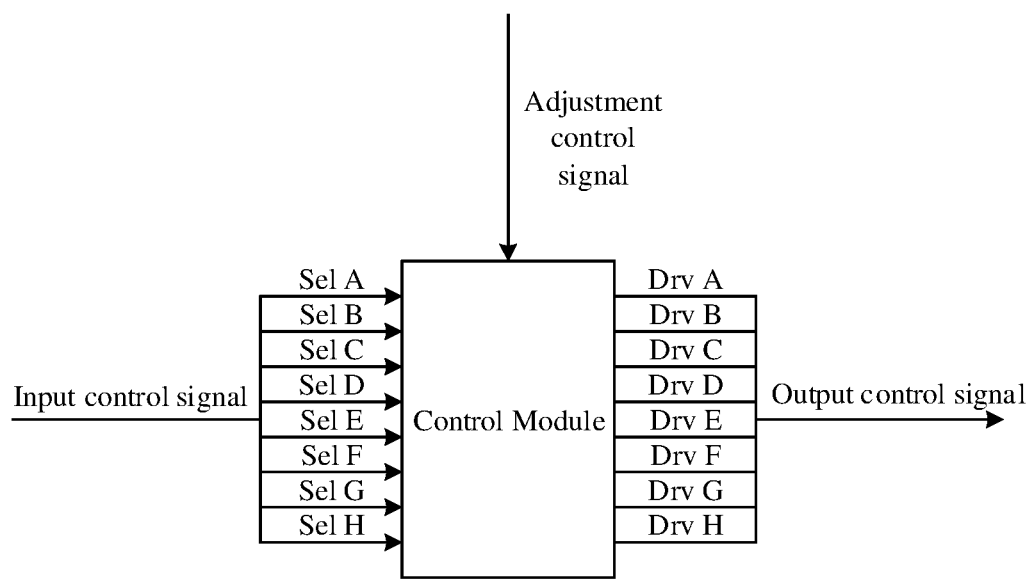
FIG. 2 is specific schematic structural diagram of a control module according to an embodiment of the disclosure.
Figure 3:
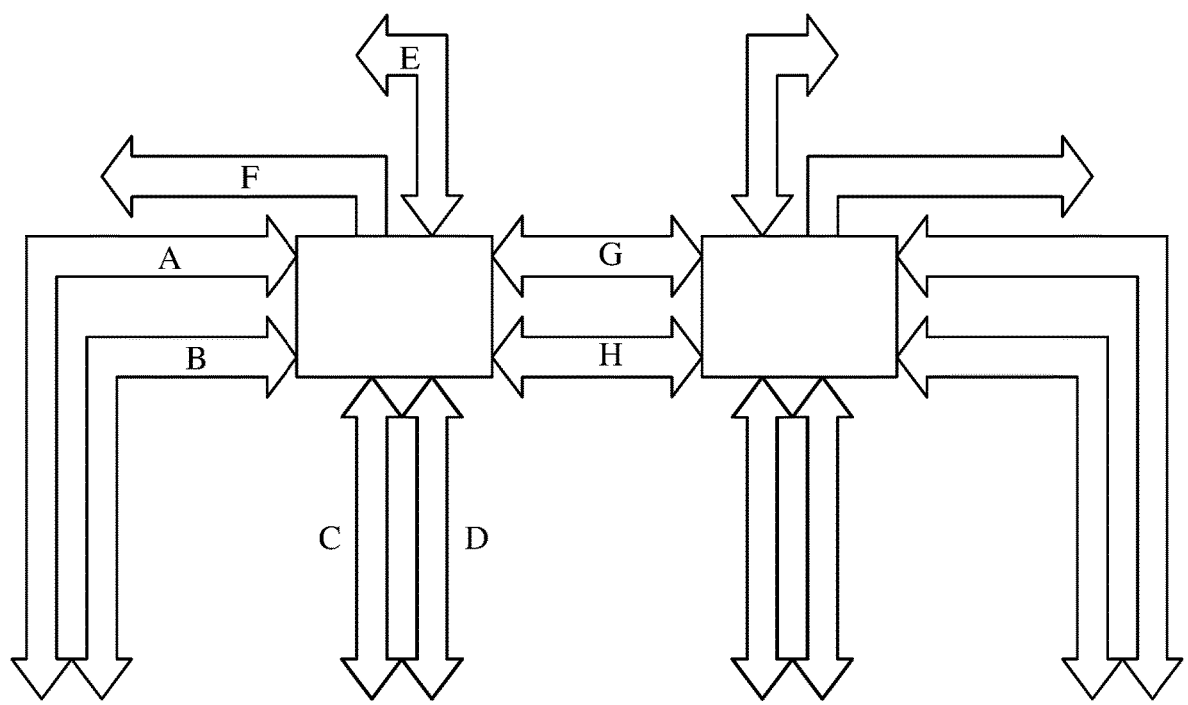
FIG. 3 is a schematic diagram of a specific connection mode of a data transmission structure according to an embodiment of the disclosure.
Figure 4:
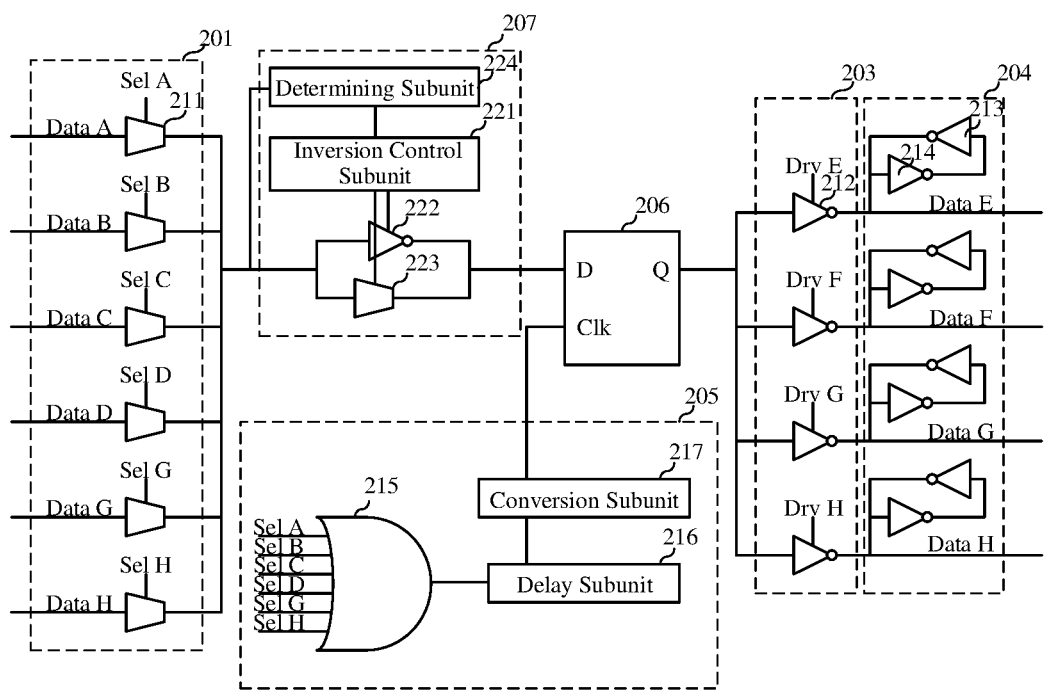
FIG. 4 is a specific schematic structural diagram of a data transmission structure during data readout according to an embodiment of the disclosure.
Figure 5:
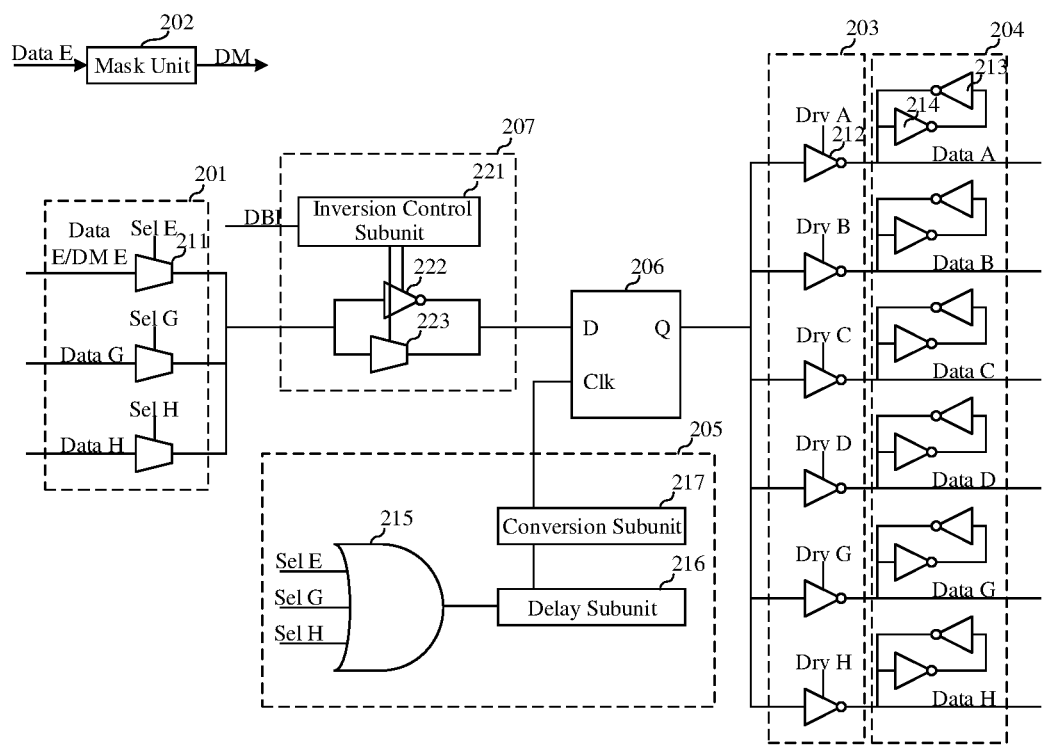
FIG. 5 is a specific schematic structural diagram of a data transmission structure during data writing according to an embodiment of the disclosure.
Figure 6:
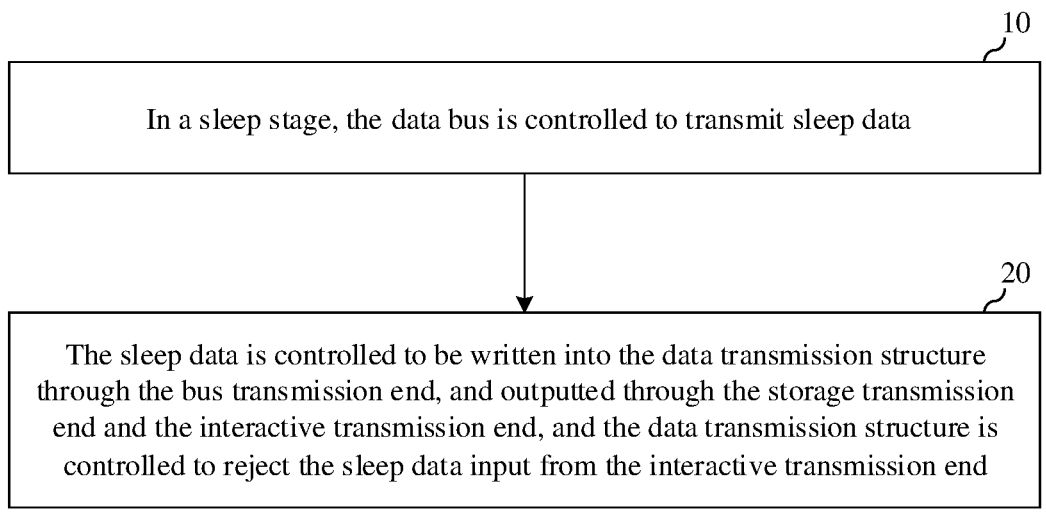
FIG. 6 is a schematic flowchart of a sleep control method according to an embodiment of the disclosure.
Figure 7:
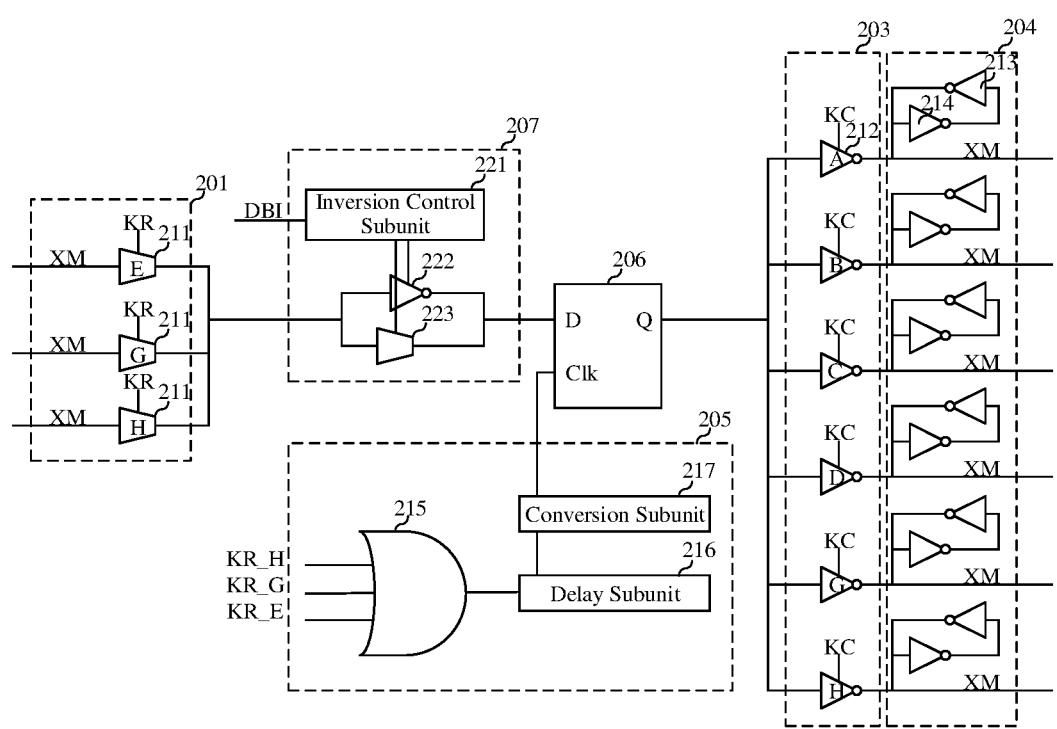
FIG. 7 is a schematic circuit diagram of a data transmission circuit applied in a sleep stage according to an embodiment of the disclosure.

FIG. 1 is a schematic structural diagram of a data transmission circuit according to an embodiment of the disclosure. FIG. 2 is a specific schematic structural diagram of a control module according to an embodiment of the disclosure. FIG. 3 is a schematic diagram of a specific connection mode of a data transmission structure according to an embodiment of the disclosure. FIG. 4 is a specific schematic structural diagram of a data transmission structure during data readout according to an embodiment of the disclosure. FIG. 5 is a specific schematic structural diagram of a data transmission structure during data writing according to an embodiment of the disclosure. FIG. 6 is a schematic flowchart of a sleep control method according to an embodiment of the disclosure. FIG. 7 is a schematic circuit diagram of a data transmission circuit applied in a sleep stage according to an embodiment of the disclosure. The sleep control method provided in the embodiment is further described in detail below with reference to the accompanying drawings, and the details are as follows.

Referring to FIG. 1, a data transmission circuit is applied to a memory. The memory includes a data bus 103 and multiple storage areas 102. The data transmission circuit is used to improve the read/write data transmission efficiency of the memory, and specifically includes at least two data transmission structures 101.

Each of the data transmission structures includes a storage transmission end 111, a bus transmission end 112, and an interactive transmission end 113. The storage transmission end 111 is configured to be connected to a storage area 102, the bus transmission end 112 is configured to be connected to a data bus 103, and the interactive transmission end 113 is configured to be connected to another data transmission structure.

In a working stage, data input from the storage transmission end 111 is output through the bus transmission end 112 or output through the interactive transmission end 113. Data input from the bus transmission end 112 is output through the storage transmission end 111 or output through the interactive transmission end 113. Data input from the interactive transmission end 113 is output through the bus transmission end 112 or output through the storage transmission end 111. The data input from the interactive transmission end 113 is data input from the bus transmission end 112 or the storage transmission end 111 of another data transmission structure 101. A control module 104 is connected to the data transmission structure 101, and receives an input control signal and an adjustment control signal provided by the memory to which the control module belongs.

Referring to FIG. 6, in a sleep stage, the sleep control method includes S10 (in a sleep stage, the data bus is controlled to transmit sleep data) and S20 (the sleep data is controlled to be written into the data transmission structure through the bus transmission end, and outputted through the storage transmission end and the interactive transmission end, and the data transmission structure is controlled to reject the sleep data input from the interactive transmission end).

Specifically, for S10, in a sleep stage, sleep data is transmitted to the data bus 103, so that the data bus 103 transmits the sleep data. For S20, the bus transmission port 112 and the storage transmission port 111 are turned on, a sending terminal of the interactive transmission port 113 is turned on, and a receiving terminal of the interactive transmission port 113 is turned off, so that data input from the bus transmission port 112 is output through the storage transmission port 111 and the interactive transmission port 113.

The bus transmission port 112 and the storage transmission port 111 are turned on, so that the sleep data transmitted on the data bus 103 is written into the storage transmission port 111. The sending terminal of the interactive transmission port 113 is turned on, so that the sleep data transmitted on the data bus 103 may be transmitted to the interactive transmission port 113, and the storage transmission port 111, the bus transmission port 112, and the interactive transmission port 113 of the data transmission structure 101 all transmit the sleep data, thereby realizing sleep. In addition, the receiving terminal of the interactive transmission port 113 is turned off, that is, the data transmission structure 101 does not receive sleep data sent from another data transmission structure 101 while the interactive transmission port 113 transmits the sleep data, that is, it is ensured that writing of the sleep data in the data transmission structure 101 is only achieved through the bus transmission port 112, which avoids an input data timing confusion of the data transmission structure 101 in a sleep mode.

In the embodiment, in the sleep stage, the sleep data transmitted to the data bus 103 is high-level data. That is, in the sleep stage, the storage transmission end 111, the bus transmission end 112, and the interactive transmission end 113 are set to the high level. In other embodiments, in the sleep stage, the sleep data transmitted to the data bus 103 is low-level data. That is, in the sleep stage, the storage transmission end 111, the bus transmission end 112, and the interactive transmission end 113 are set to the low level, to further reduce power consumption in the sleep stage.

Referring to FIG. 1 and in conjunction with FIG. 2, in the working stage, the control module 104 is configured to, based on the adjustment control signal, delay the input control signal and output delayed the input control signal to generate an output control signal corresponding to the input control signal. The input control signal and the output control signal are configured to indicate a data transmission path of the data transmission structure 101.

The adjustment control signal is generated based on the memory to which the data transmission circuit belongs, and is configured to control a delay between the respective input control signal and output control signal.

Data transmission paths of two data transmission structures 101 are controlled by the control module 104, so that different data transmission structures can transmit data at the same time. Corresponding to the same data transmission structure 101, data alternative transmission of different storage areas 102 may be realized, so that the data transmission is tighter, thereby improving the data transmission efficiency of the memory.

It is to be noted that, in other embodiments, the number of data transmission structures may be any even number greater than 2, and the above-mentioned data transmission circuit is constituted by data transmission structures pairwise, thereby further improving the data transmission efficiency of the memory.

Specifically, a signal delay between the input control signal and the output control signal is controlled by the adjustment control signal, which is conductive to preventing an output terminal from being turned on earlier or later than a preset timing, and ensures that the data transmission structure accurately outputs the corresponding input data.

Referring to FIG. 1 and FIG. 3, in some embodiments, the storage transmission end 111 includes: a first transmission end A and a second transmission end B, the first transmission end A and the second transmission end B are connected to a same storage area, the first transmission end A is configured to transmit low-level data, and the second transmission end B is configured to transmit high-level data. The bus transmission end 112 includes: a fifth transmission end E and a sixth transmission end F. The interactive transmission end 113 includes: a seventh transmission end G and an eighth transmission end H. The fifth transmission end E is configured to perform data interactive transmission between the data transmission structure 101 to which the fifth transmission end belongs and the data bus 103. The sixth transmission end F is configured to perform unidirectional data transmission to the data bus 103 from the data transmission structure 101 to which the sixth transmission end belongs. The seventh transmission end G and the eighth transmission end H are configured to perform data interactive transmission between the two data transmission structures 101.

It is to be noted that, in the embodiment, both the seventh transmission end G and the eighth transmission end H may be configured to perform data interactive transmission between the two data transmission structures 101. In other embodiments, the data transmission structure on the left transmits data to the data transmission structure on the right through the seventh transmission end, and the data transmission structure on the right transmits data to the data transmission structure on the left through the eighth transmission end.

The operation that in the sleep stage, the bus transmission end 112 and the storage transmission end 111 are turned on, a sending terminal of the interactive transmission end 113 is turned on, and a receiving terminal of the interactive transmission end 113 is turned off includes: a receiving terminal of the fifth transmission end E is turned, a sending terminal of the sixth transmission end F is turned; a sending terminal of the first transmission end A and a sending terminal of the second transmission end B are turned on; and a sending terminal of the seventh transmission end G and a sending terminal of the eighth transmission end H are turned on, and a receiving terminal of the seventh transmission end G and a receiving terminal of the eighth transmission end H are turned off.

In other embodiments, if the data transmission structure on the left transmits data to the data transmission structure on the right through the seventh transmission end, and the data transmission structure on the right transmits data to the data transmission structure on the left through the eighth transmission end, then the operation that a sending terminal of the seventh transmission end and a sending terminal of the eighth transmission end are turned on, and a receiving terminal of the seventh transmission end and a receiving terminal of the eighth transmission end are turned off is correspondingly adjusted as: for the data transmission structure on the left, a sending terminal of the seventh transmission end is turned on, and a receiving terminal of the eighth transmission end is turned off; and for the data transmission structure on the right, a sending terminal of the eight transmission end is turned on, and a receiving terminal of the seventh transmission end is turned off.

In some other embodiments, the storage transmission end 111 further includes: a third transmission end C and a fourth transmission end D. The third transmission end C and the fourth transmission end D are connected to a same storage area, the first transmission end A and the third transmission end C are connected to different storage areas, the third transmission end is configured to transmit low-level data, and the fourth transmission end is configured to transmit high-level data.

Here, the operation that, in the sleep stage, the bus transmission end 112 and the storage transmission end 111 are turned on, a sending terminal of the interactive transmission end 113 is turned on, and a receiving terminal of the interactive transmission end 113 is turned off further includes: a sending terminal of the third transmission end C and a sending terminal of the fourth transmission end D are turned on.

It is to be noted that, the first transmission end A and the second transmission end B may be configured to transmit high-order data and low-order data of same data. For example, for transmission of 16-bit data, the first transmission end A is configured to transmit low 8-bit data, and the second transmission end B is configured to transmit high 8-bit data. The first transmission end A and the second transmission end B may also be configured to transmit different data. For example, for transmission of 8-bit data, the first transmission end A and the second transmission end B are configured to transmit different data.

It is to be noted that in the working stage, the first transmission end A and the second transmission end B are respectively configured to perform data interaction with the data bus 103 that is connected to the different data transmission structures 101. In the sleep stage, the first transmission end A and the second transmission end B are configured to send the sleep data input from the data bus 103 that is connected to the data transmission structure 101 to which the first transmission end A and the second transmission end B belong. In the working stage, the first transmission end A and the third transmission end C perform data transmission alternately, the second transmission end B and the fourth transmission end D perform data transmission alternately, the first transmission end A and the second transmission end B perform data transmission simultaneously, and the third transmission end C and the fourth transmission end D perform data transmission simultaneously. In the sleep stage, the first transmission end A, the second transmission end B, the third transmission end C, and the fourth transmission end D send data simultaneously.

In some embodiments, referring to FIG. 2, and in conjunction with FIG. 3, the input control signal includes Sel A, Sel B, Sel C, Sel D, Sel E, Sel F, Sel G, and Sel H; the output control signal includes Dry A, Dry B, Dry C, Dry D, Dry E, Dry F, Dry G, and Dry H.

The input control signal corresponding to the first transmission end A is Sel A, and the output control signal corresponding to the first transmission end A is Dry A; the input control signal corresponding to the second transmission end B is Sel B, and the output control signal corresponding to the second transmission end B is Dry B; the input control signal corresponding to the third transmission end C is Sel C, and the output control signal corresponding to the third transmission end C is Dry C; the input control signal corresponding to the fourth transmission end D is Sel D, and the output control signal corresponding to the fourth transmission end D is Dry D; the input control signal corresponding to the fifth transmission end E is Sel E, and the output control signal corresponding to the fifth transmission end E is Dry E; the input control signal corresponding to the sixth transmission end F is Sel F, and the output control signal corresponding to the sixth transmission end F is Dry F; the input control signal corresponding to the seventh transmission end G is Sel G, and the output control signal corresponding to the seventh transmission end G is Dry G; and the input control signal corresponding to the eight transmission end H is Sel H, and the output control signal corresponding to the eight transmission end H is Dry H.

In the working stage, referring to FIG. 4 and FIG. 5, the data transmission structure 101 includes: an input unit 201, for receiving at least one input data and input control signal, and configured to, based on the input control signal, output the input data corresponding to the input control signal data; an output unit 203, for receiving the input data output from the input unit 201 and at least one output control signal, and configured to, based on a valid port represented by the output control signal, output the input data; and a latch unit 204, connected to the output unit 203 and configured to latch the input data output from the output unit 203.

In the sleep stage, referring to FIG. 7, the data transmission structure 101 includes: an input unit 201, for receiving sleep data XM and a sleep input control signal KR, and configured to, based on the sleep input control signal KR, input the sleep data XM; an output unit 203, for receiving the sleep data XM and a sleep output control signal KC, and configured to, based on the sleep output control signal KC, output the sleep data XM; and a latch unit 204 connected to the output unit 203 and configured to latch the sleep data XM output from the output unit 203.

During the working stage, the input unit 201 includes: multiple input controllers 211, each input controller 211 corresponds to the storage transmission end 111, the bus transmission end 112 or the interactive transmission end 113. Each input controller 211 is configured to receive input control signals and input data from the corresponding storage transmission end 111, bus transmission end 112 or interactive transmission end 113; and the input controller 211 is configured to, based on the input control signal, turn on the corresponding port to output the input data of the corresponding port.

Specifically, for data readout, referring to FIG. 4, data of a storage area connected to the data transmission structure 101 is read out through the first transmission end A, the second transmission end B, the third transmission end C or the fourth transmission end D, or data of a storage area connected to another data transmission structure 101 may be read out through the seventh transmission end G and the eighth transmission end H.

Input data Data A of the first transmission end A is connected to an input controller 211; the input controller is controlled by the input control signal Sel A, and outputs the input data Data A of the first transmission end A when receiving the input control signal Sel A. Input data Data B of the second transmission end B is connected to an input controller 211; the input controller is controlled by the input control signal Sel B and outputs the input data Data B of the second transmission end B when receiving the input control signal Sel B. Input data Data C of the third transmission end C is connected to an input controller 211; the input controller is controlled by the input control signal Sel C, and outputs the input data Data C of the third transmission end C when receiving the input control signal Sel C. Input data Data D of the fourth transmission end D is connected to an input controller 211; the input controller is controlled by the input control signal Sel D, and outputs the input data Data D of the fourth transmission end D when receiving the input control signal Sel D. Input data Data G of the seventh transmission end G is connected to an input controller 211; the input controller is controlled by the input control signal Sel G, and outputs the input data Data G of the seventh transmission end G when receiving the input control signal Sel G. Input data Data H of the eighth transmission end H is connected to an input controller 211; the input controller is controlled by the input control signal Sel H, and outputs the input data Data H of the eighth transmission end H when receiving the input control signal Sel H.

Specifically, for data writing, referring to FIG. 5, write data is written into the data transmission structure 101 through the fifth transmission end E, or write data received by another data transmission structure 101 may be written through the seventh transmission end G and the eighth transmission end H.

Input data Data E of the fifth transmission end E is connected to an input controller 211; the input controller is controlled by the input control signal Sel E, and outputs the input data Data E of the fifth transmission end E when receiving the input control signal Sel E. Input data Data G of the seventh transmission end G is connected to an input controller 211; the input controller is controlled by the input control signal Sel G, and outputs the input data Data G of the seventh transmission end G when receiving the input control signal Sel G. Input data Data H of the eighth transmission end H is connected to an input controller 211; the input controller is controlled by the input control signal Sel H, and outputs the input data Data H of the eighth transmission end H when receiving the input control signal Sel H.

In some embodiments, the data transmission structure further include a mask unit 202 that is configured to generate mask data DM according to the input data Data E of the fifth transmission end E. The mask data DM is input through the input controller 211 corresponding to the fifth transmission end E so as to realize selection input of data on the data bus 103.

Specifically, the memory has a data mask function and a data inversion function. When a data mask is valid, the corresponding 8-bit data is not written. In the case where 1 is in the majority in the written 8-bit data, the written 8-bit data is inverted if more power is saved in transmission of 0 by a transmission path. When both the data mask (DM) and databus inversion (DBI) functions are enabled, since both a data mask signal and a data inversion signal need to use the same data port, only one of them may be selected for input. In the disclosure, the data inversion signal is selected and inputted. That is, during data writing, the input data and the data inversion signal are transmitted to the data transmission structure together, and when the data inversion signal is valid, it is indicated that the input data Data E input synchronously needs to be inverted. Since there is no need to invert if the input data Data E is not written, that the data inversion signal is valid also indicates that the input data Data E needs to be written. When the data inversion signal is invalid, if the input data is normal input, then 0 should be in the majority in the input data. That is, when the data inversion signal is invalid, it is necessary to detect whether 0 in the input data accounts for half or more. If it accounts for half or more, data inversion is omitted and normal input is performed. If 0 is in the minority and 1 is in the majority, it means that at this point, the input data indicates that the data mask signal is valid, and the corresponding 8-bit input data is masked and not stored in a memory array.

That is, when the data inversion signal is valid, the fifth transmission end E receives 8-bit original data to be written, and an inversion unit 207 receives an inversion control signal DBI. The inversion control signal DBI here indicates that the data inversion signal is valid. For example, the inversion control signal DBI is 1, and data input by the input unit 201 is inverted to output to the output unit 203. When the data inversion signal is invalid, it is determined according to the content of Data E that the fifth transmission end E receives the 8-bit original data or mask data DM to be written. Specifically, when the data inversion signal is invalid, the input/output Data E is compiled by the mask unit 202 to determine whether the data mask signal is valid (assuming that 1 is a valid value, and 0 is an invalid value); if it is indicated that the data mask DM is valid, it means that the 8-bit original data does not need to be written, and then the fifth transmission end E receives the masked data DM; if it is indicated that the data mask DM is invalid, it means that the 8-bit original data needs to be written, and then the fifth transmission end E receives the input data Data E.

It is to be noted that any data transmission structure only inverts the corresponding data input by the fifth transmission end E, that is, during data writing, the inversion control signal DBI received by an inversion control subunit 221 is only the inversion control signal corresponding to the input data Data E, but not the inversion control signal corresponding to the input data Data G and Data H. This is because for data input from the seventh input end Sel G and the eighth input end Sel H, that is, the data input from the data bus 103 through another data transmission structure, the input data has completed the above data inversion process in the inversion unit 207 of another data transmission structure.

In the sleep stage, referring to FIG. 7, the input unit 201 includes multiple input controllers 211, each of the input controllers corresponds to the bus transmission end 112 or the interactive transmission end 113, and each of the input controllers 211 receiving the sleep data XM. Each of the input controllers 211 is configured to receive the sleep input control signal KR corresponding to the bus transmission end 112 or the interactive transmission end 113. In the sleep stage, the input controller 211 corresponding to the bus transmission end is turned on, based on the sleep input control signal KR.

Specifically, the sleep input control signal KR is transmitted to the fifth transmission end E, the seventh transmission end G and the eighth transmission end H to turn on the fifth transmission end E and turn off the seventh transmission end G and the eighth transmission end H, so that the sleep data XM is written into the data transmission structure 101 from the data bus 103 through the fifth transmission end E. Since the seventh transmission end G and the eighth transmission end H are turned off, that is, the receiving terminal of the interactive transmission end 113 is turned off, the sleep data XM cannot be written into another data transmission structure 101 through the seventh transmission end G or the eighth transmission end H, thus avoiding the data timing confusion.

During the working stage, the output unit 203 includes: multiple output controllers 212, each output controller 212 corresponds to the storage transmission end 111, the bus transmission end 112 or the interactive transmission end 113. Each output controller 212 is configured to receive output control signals and input data from the corresponding storage transmission end 111, bus transmission end 112 or interactive transmission end 113. The output controller 212 is configured to, based on the output control signal, turn on the corresponding port to output the input data.

Specifically, for data readout, referring to FIG. 4, the readout data is read out to the data bus 103 through the fifth transmission end E or the sixth transmission end F, and may also be read out to another data transmission structure 101 through the seventh transmission end G and the eighth transmission end H, and finally read out to another corresponding data bus 103 through the fifth transmission end E or the sixth transmission end F corresponding to the another data transmission structure 101.

The output controller 212 connected to the fifth transmission end E is controlled by the output control signal Dry E, and outputs data through the fifth transmission end E when receiving the output control signal Dry E. The output controller 212 connected to the seventh transmission termina G is controlled by the output control signal Dry G, and outputs data through the seventh transmission end G when receiving the output control signal Dry G. The output controller 212 connected to the eighth transmission end H is controlled by the output control signal Dry H, and outputs data through the eighth transmission end H when receiving the output control signal Dry H.

Specifically, for data writing, referring to FIG. 5, write data is written into a storage area connected to the data transmission structure 101 through the first transmission end A, the second transmission end B, the third transmission end C or the fourth transmission end D, or may be written into a storage area connected to another data transmission structure 101 through the seventh transmission end G and the eighth transmission end H.

The output controller 212 connected to the first transmission end A is controlled by the output control signal Dry A, and outputs data through the first transmission end A when receiving the output control signal Dry A. The output controller 212 connected to the second transmission end B is controlled by the output control signal Dry B, and outputs data through the second transmission end B when receiving the output control signal Dry B. The output controller 212 connected to the third transmission end C is controlled by the output control signal Dry C, and outputs the data through the third transmission end C when receiving the output control signal Dry C. The output controller 212 connected to the fourth transmission end D is controlled by the output control signal Dry D, and outputs data through the fourth transmission end D when receiving the output control signal Dry D. The output controller 212 connected to the seventh transmission end G is controlled by the output control signal Dry G, and outputs data through the seventh transmission end G when receiving the output control signal Dry G. The output controller 212 connected to the eighth transmission end H is controlled by the output control signal Dry H, and outputs data through the eighth transmission end H when receiving the output control signal Dry H.

In the sleep stage, the output unit 203 includes multiple output controllers, each of the output controllers 212 correspondS to the storage transmission end 111 or the interactive transmission end 113, and each of the output controllers 212 receive the sleep data XM. Each of the output controllers is configured to receive the sleep output control signal KC corresponding to the storage transmission end 111 or the interactive transmission end 113. In the sleep stage, the output controller 212 corresponding to the storage transmission end 111 and the interactive transmission end 113 is turned on, based on the sleep output control signal KC.

Specifically, referring to FIG. 7, the sleep output control signal KC is transmitted to the first transmission end A, the second transmission end B, the third transmission end C, the fourth transmission end D, the seventh transmission end G and the eighth transmission end H, to turn on the first transmission end A, the second transmission end B, the third transmission end C, the fourth transmission end D, the seventh transmission end G and the eighth transmission end H, so that the sleep data XM is output through the first transmission end A, the second transmission end B, the third transmission end C, the fourth transmission end D, the seventh transmission end G and the eighth transmission end H. The seventh transmission end G and the eighth transmission end H are turned on, that is, the sending terminal of the interactive transmission end 113 is turned on, the sleep data XM is transmitted to another data transmission end through the seventh transmission end G and the eighth transmission end H, and thus, the interactive transmission end 113 transmits the sleep data XM.

In the embodiment, the latch unit 204 includes: a first inverter 214 and a second inverter 213 connected end to end, an input terminal of the first inverter 214 and an output terminal of the second inverter 213 are connected in parallel with an output terminal of the output unit 203. The latch unit 204 is connected in parallel with the output terminal of the output unit 203 to realize storage of output data of the output unit 203. It should be noted that, in other embodiments, the latch unit includes: a first inverter and a second inverter connected end to end, an input terminal of the first inverter and an output terminal of the second inverter are connected in series with an output port of the input unit; the latch unit is connected in series with an output terminal of the output unit to realize inversed latching of output data of the output unit; and subsequently, the inverters are connected in series to realize storage of the output data of the output unit.

In some embodiments, an input of data is delayed to further ensure the accuracy of the data in a multi-path transmission.

Specifically, in the working stage, the data transmission structure, as shown in FIG. 4 and FIG. 5, further includes: an input selection unit 205 and a trigger unit 206.

The input selection unit 205, for receiving at least one input control signal, is configured to generate a strobe pulse corresponding to the input control signal, the strobe pulse corresponding to a valid port represented by the input control signal, and a selection delay is provided between the strobe pulse and the input control signal. The trigger unit 206, having a clock terminal connected to the input selection unit 205, an input terminal connected to the input unit 201, an output terminal connected to the output unit 203, is configured to, based on the strobe pulse, transmit the input data received by the input terminal to the output terminal.

In the sleep stage, the data transmission structure, referring to FIG. 7, further includes: an input selection unit 205 and a trigger unit 206.

The input selection unit 205 is configured to receive the sleep input control signal KR, specifically, to receive a sleep input control signal KR_E corresponding to the fifth transmission end, a sleep input control signal KR_G corresponding to the seventh transmission end, and a sleep input control signal KR_H corresponding to the eighth transmission end. The input selection unit 205 is configured to generate a strobe pulse corresponding to the sleep input control signal, the strobe pulse corresponds to a valid port represented by the sleep input control signal KR, and a selection delay is provided between the strobe pulse and the sleep input control signal KR. The trigger unit 206, having a clock terminal connected to the input selection unit 205, an input terminal connected to the input unit 201, an output terminal connected to the output unit 203, is configured to, based on the strobe pulse, output the sleep data XM.

In the working stage, the input selection unit 205 includes: a trigger subunit 215 configured to receive at least one input control signal, and generate an indicator signal if it receives the input control signal; a delay subunit 216 connected to the trigger subunit 215 and configured to delay the indicator signal; and a conversion subunit 217 connected to the delay subunit 216 and configured to convert the delayed indicator signal into the strobe pulse.

The indicator signal is delayed by the delay subunit 216 to ensure that the data transmission structure accurately outputs the corresponding input data. A specific delay parameter of the delay subunit 216 is set based on the memory to which it belongs. In some embodiments, the specific delay parameter of the delay subunit 216 may be adjusted by working staff.

In the embodiment, the trigger subunit 215 is implemented by an OR gate. During data readout, referring to FIG. 4, the input control signal Sel A, Sel B, Sel C, Sel D, Sel G or Sel H is input into the trigger subunit 215, and the trigger subunit 215 generates an indicator signal based on an active level of the input control signal Sel A, Sel B, Sel C, Sel D, Sel G or Sel H; the indicator signal is delayed by the delay subunit 216, and then converted into a strobe pulse by the conversion subunit 217 to drive the trigger unit 206. During data writing, referring to FIG. 5, the input control signal Sel E, Sel G or Sel H is input to the trigger subunit 215, and the trigger subunit 215 generates an indicator signal based on an active level of the input control signal Sel E, Sel G or Sel H; the indicator signal is delayed by the delay subunit 216, and then converted into a strobe pulse by the conversion subunit 217 to drive the trigger unit 206.

In the sleep stage, the input selection unit 205 includes: the trigger subunit 215, configured to receive at least one sleep input control signal KR, specifically, to receive a sleep input control signal KR_E corresponding to the fifth transmission end, a sleep input control signal KR_G corresponding to the seventh transmission end, and a sleep input control signal KR_H corresponding to the eighth transmission end, and generate an indicator signal if the trigger subunit 215 receives the sleep input control signal KR; the delay subunit 216, connected to the trigger subunit 215, and configured to delay the indicator signal; the conversion subunit 217 connected to the delay subunit 216, and configured to convert the delayed indicator signal into a strobe pulse.

The indicator signal is delayed by the delay subunit 216 to ensure that the data transmission structure accurately outputs the corresponding input data. A specific delay parameter of the delay subunit 216 is set based on a memory to which it belongs. In some embodiments, the specific delay parameter of the delay subunit 216 may be adjusted by working staff.

In some embodiments, the trigger unit is composed of a D-trigger.

In some embodiments, the data transmission structure 101 further includes: an inversion unit 207, arranged between the trigger unit 206 and the input unit 201, and configured to, based on the inversion control signal, output the input data, or invert the input data and output the inverted input data.

The inversion control signal is output after the data is quantized, and the data is directly output or output after being inverted through the inversion unit, so that the data energy consumption of the data transmission structure 101 is reduced. Specifically, since transmission of low-level data consumes less energy, the energy consumption can be saved by transmitting the data at a low level. The data is quantized, if high-level data in the data is more than the low-level data, the data is controlled by the inversion control signal to be inverted and then transmitted; if the high-level data in the data is less than the low-level data, the data is controlled by the inversion control signal to be directly transmitted.

Referring to 4 and 5, the inversion unit 207 includes: an inversion control subunit 221 configured to receive an inversion control signal and generate, based on the inversion control signal, a first control signal and a second control signal; a first selection subunit 222 and a second selection subunit 223 that are connected in parallel, with an input terminal for receiving input data, and an output terminal connected to the trigger unit 206. The first selection subunit 222 is configured to be turned on based on the first control signal, and output the input data after inverting the input data; the second selection subunit 223 is configured to be turned on based on the second control signal, and output the input data directly.

It is to be noted that the first control signal and the second control signal may be used as two signals to drive the first selection subunit 222 and the second selection subunit 223, and may also be used as the high and low levels of the same signal to drive the first selection subunit 222 and a second selection subunit 223.

Referring to FIG. 4, in some embodiments, the inversion unit 207 further includes: a determining subunit 224 configured to receive the input data and generate, based on the input data, an inversion control signal.

It is to be noted that a signal driving method mentioned in the embodiment is described by taking the existence of a signal as an example. In a specific application, it can be driven according to whether a signal exists or not, or it can be driven according to the high and low levels of the signal, that is, the signal exists, and it can be driven according to whether the level of the signal is an active level.

The bus transmission end and the storage transmission end are turned on, so that the sleep data transmitted on the data bus is written into the storage area. The sending terminal of the interactive transmission end is turned on, so that the sleep data transmitted on the data bus may be transmitted to the interactive transmission end, and the storage transmission end, the bus transmission end, and the interactive transmission end of the data transmission structure all transmit the sleep data, thereby realizing sleep. In addition, the receiving terminal of the interactive transmission end is turned off, that is, the data transmission structure does not receive sleep data sent from another data transmission structure while the interactive transmission end transmits the sleep data, it is ensured that writing of the sleep data in the data transmission structure is only achieved through the bus transmission end, which avoids an input data timing confusion of the data transmission structure in a sleep mode.

Another embodiment of the disclosure provides a sleep control circuit, which is applied to the above-mentioned embodiment of the sleep control method Aiming at a data transmission circuit for improving read/write data transmission efficiency of a memory, a sleep control method of the data transmission circuit is provided.

The sleep control circuit provided in the embodiment is described in detail below. The details are as follows.

The sleep control circuit includes a data providing unit, a first data control unit, and a second data control unit.

The data providing unit is configured to send sleep data to a data bus in a sleep stage.

The first data control unit is configured to, in the sleep stage, turn on the storage transmission end and the bus transmission end, control the data transmission circuit to receive the sleep data transmitted from the data bus, and to send the sleep data to a storage area.

The second data control unit is configured to, in the sleep stage, turn on the interactive transmission end, and control the data transmission structure to send the sleep data to another one of the data transmission structure and to reject to receive the sleep data sent by the other data transmission structure.

Specifically, the first data control unit includes a first data receiving subunit and a first control unit.

The first data receiving subunit is configured to receive a sleep input control signal and a sleep output control signal.

The first control unit is connected to the first data receiving subunit, and is configured to turn on the bus transmission end according to the sleep input control signal, and turn on the storage transmission end according to the sleep output control signal.

Specifically, the second data control unit includes a second data receiving subunit and a second control unit.

The second data receiving subunit is configured to receive a sleep input control signal and a sleep output control signal.

The second control unit is connected to the second data receiving subunit, and is configured to turn on a sending terminal of the interactive transmission end according to the sleep output control signal, and turn off a receiving terminal of the interactive transmission end according to the sleep input control signal.

The bus transmission end and the storage transmission end are turned on, so that the sleep data transmitted on the data bus is written into the storage area. The sending terminal of the interactive transmission end is turned on, so that the sleep data transmitted on the data bus may be transmitted to the interactive transmission end, and the storage transmission end, the bus transmission end, and the interactive transmission end of the data transmission structure all transmit the sleep data, thereby realizing sleep. In addition, the receiving terminal of the interactive transmission end is turned off, that is, the data transmission structure does not receive sleep data sent from another data transmission structure while the interactive transmission end transmits the sleep data, it is ensured that writing of the sleep data in the data transmission structure is only achieved through the bus transmission end, which avoids an input data timing confusion of the data transmission structure in a sleep mode.

Further, it should be noted that the modules or units for executing the sleep control method according to the embodiment of the present disclosure, for example, the input unit, the output unit, an input selection unit can be implemented by hardware such as circuits and processors.

Those of ordinary skill in the art can understand that the above-mentioned embodiments are specific embodiments for implementation of the disclosure, and in practical applications, various changes can be made in form and details without departing from the spirit and scope of the disclosure.

The invention claimed is:

1. A sleep control method, applied to a data transmission circuit, the data transmission circuit comprises at least two data transmission structures;
   each of the data transmission structures comprises a storage transmission end, a bus transmission end, and an interactive transmission end, the storage transmission end is configured to be connected to a storage area, the bus transmission end is configured to be connected to a data bus, and the interactive transmission end is configured to be connected to another data transmission structure;
   and the sleep control method comprising: in a sleep stage, transmitting sleep data to the data bus; and
   turning on the bus transmission end and the storage transmission end, turning on a sending terminal of the interactive transmission end, and turning off a receiving terminal of the interactive transmission end, so that data input from the bus transmission end is output through the storage transmission end and the interactive transmission end.

2. The sleep control method of claim 1, wherein the sleep data transmitted to the data bus is high-level data.

3. The sleep control method of claim 1, wherein
   the storage transmission end comprises: a first transmission end and a second transmission end, wherein the first transmission end and the second transmission end are connected to a same storage area, the first transmission end is configured to transmit low-level data, and the second transmission end is configured to transmit high-level data;

the bus transmission end comprises a fifth transmission end and a sixth transmission end, wherein the fifth transmission end is configured to perform data interactive transmission between the data transmission structure to which the fifth transmission end belongs and the data bus, and the sixth transmission end is configured to perform unidirectional data transmission from the data transmission structure to which the sixth transmission end belongs to the data bus;

the interactive transmission end comprises: a seventh transmission end and an eighth transmission end, wherein the seventh transmission end and the eighth transmission end are configured to perform data interactive transmission between two of the data transmission structures; wherein turning on the bus transmission end and the storage transmission end, turning on the sending terminal of the interactive transmission end, and turning off the receiving terminal of the interactive transmission end comprise:

turning on a receiving terminal of the fifth transmission end and turning on a sending terminal of the sixth transmission end;

turning on a sending terminal of the first transmission end and a sending terminal of the second transmission end; and turning on a sending terminal of the seventh transmission end and a sending terminal of the eighth transmission end, and turning off a receiving terminal of the seventh transmission end and a receiving terminal of the eighth transmission end.

4. The sleep control method of claim 3, wherein the storage transmission end further comprises: a third transmission end and a fourth transmission end, wherein the third transmission end and the fourth transmission end are connected to a same storage area, the first transmission end and the third transmission end are connected to different storage areas, the third transmission end is configured to transmit low-level data, and the fourth transmission end is configured to transmit high-level data; wherein turning on the bus transmission ends and the storage transmission ends, turning on the sending terminal of the interactive transmission ends, and turning off the receiving terminal of the interactive transmission end further comprises:

turning on a sending terminal of the third transmission end and a sending terminal of the fourth transmission end.

5. The sleep control method of claim 4, wherein in a working stage, the first transmission end and the second transmission end are respectively configured to perform data interaction with the data bus that is connected to the different data transmission structures;

in the sleep stage, the first transmission end and the second transmission end are configured to send the sleep data input from the data bus that is connected to the data transmission structure to which the first transmission end and the second transmission end belong;

in the working stage, the first transmission end and the third transmission end perform data transmission alternately, the second transmission end and the fourth transmission end perform data transmission alternately, the first transmission end and the second transmission end perform data transmission simultaneously, and the third transmission end and the fourth transmission end perform data transmission simultaneously; and in the sleep stage, the first transmission end, the second transmission end, the third transmission end, and the fourth transmission end send data simultaneously.

6. The sleep control method of claim 1, wherein the data transmission structure comprises:

an input unit, for receiving the sleep data and a sleep input control signal, and configured to, based on the sleep input control signal, input the sleep data;

an output unit, for receiving the sleep data and a sleep output control signal, and configured to, based on the sleep output control signal, output the sleep data; and a latch unit, connected to the output unit, and configured to latch the sleep data output from the output unit.

7. The sleep control method of claim 6, wherein the input unit comprises:

multiple input controllers, each of the input controllers corresponds to the bus transmission end or the interactive transmission end, and each of the input controllers receives the sleep data; wherein each of the input controllers is configured to receive the sleep input control signal corresponding to the bus transmission end or the interactive transmission end; and in the sleep stage, the input controller corresponding to the bus transmission end is turned on, based on the sleep input control signal.

8. The sleep control method of claim 6, wherein the output unit comprises:

multiple output controllers, each of the output controllers corresponds to the storage transmission end or the interactive transmission end, and each of the output controllers receives the sleep data; wherein each of the output controllers is configured to receive the sleep output control signal corresponding to the storage transmission end or the interactive transmission end; and in the sleep stage, the output controllers corresponding to the storage transmission end and the interactive transmission end are turned on, based on the sleep output control signal.

9. The sleep control method of claim 6, wherein the latch unit comprises: a first inverter and a second inverter connected end to end, an input terminal of the first inverter and an output terminal of the second inverter are connected in parallel with an output terminal of the output unit.

10. The sleep control method of claim 6, wherein the data transmission structure further comprises:

an input selection unit, for receiving the sleep input control signal, and configured to generate a strobe pulse corresponding to the sleep input control signal, the strobe pulse corresponds to a valid port represented by the sleep input control signal, and a selection delay is provided between the strobe pulse and the sleep input control signal; and a trigger unit, having a clock terminal connected to the input selection unit, an input terminal connected to the input unit, an output terminal connected to the output unit, and configured to, based on the strobe pulse, output the sleep data.

11. The sleep control method of claim 10, wherein the input selection unit comprises:

a trigger subunit, configured to receive the sleep input control signal, and generate an indicator signal in response to receiving the sleep input control signal;
a delay subunit, connected to the trigger subunit, and configured to delay the indicator signal; and
a conversion subunit, connected to the delay subunit, and configured to convert the delayed indicator signal into the strobe pulse.

12. The sleep control method of claim 10, wherein the trigger unit is composed of a D-trigger.

13. A sleep control circuit, applied to the sleep control method of claim 1, comprising:
a data providing unit, configured to send sleep data to a data bus in a sleep stage;
a first data control unit, configured to, in the sleep stage, turn on the storage transmission end and the bus transmission end, and control the data transmission circuit to receive the sleep data transmitted from the data bus and to send the sleep data to a storage area; and
a second data control unit, configured to, in the sleep stage, turn on the interactive transmission end, and control the data transmission structure to send the sleep data to another data transmission structure and to reject to receive the sleep data sent from the another data transmission structure.

14. The sleep control circuit of claim 13, wherein the first data control unit comprises:
a first data receiving subunit, configured to receive a sleep input control signal and a sleep output control signal; and
a first control unit, connected to the first data receiving subunit, and configured to turn on the bus transmission end according to the sleep input control signal, and turn on the storage transmission end according to the sleep output control signal.

15. The sleep control circuit of claim 13, wherein the second data control unit comprises:
a second data receiving subunit, configured to receive a sleep input control signal and a sleep output control signal; and
a second control unit, connected to the second data receiving subunit, and configured to turn on a sending terminal of the interactive transmission end according to the sleep output control signal, and turn off a receiving terminal of the interactive transmission end according to the sleep input control signal.

* * * * *